United States Patent

Hodges et al.

[11] Patent Number: 5,811,865
[45] Date of Patent: Sep. 22, 1998

[54] DIELECTRIC IN AN INTEGRATED CIRCUIT

[75] Inventors: Robert L. Hodges, Euless; Frank R. Bryant, Denton, both of Tex.

[73] Assignee: STMicroelectronics, Inc., Carrollton, Tex.

[21] Appl. No.: 767,343

[22] Filed: Dec. 16, 1996

Related U.S. Application Data

[60] Continuation of Ser. No. 438,391, May 10, 1995, abandoned, which is a division of Ser. No. 251,781, May 31, 1994, abandoned, which is a continuation-in-part of Ser. No. 172,636, Dec. 22, 1993, Pat. No. 5,543,343.

[51] Int. Cl.$^6$ ................................. H01L 29/78
[52] U.S. Cl. ................... 257/411; 257/396; 257/640; 257/752
[58] Field of Search ........................... 257/411, 752, 257/640, 396

[56] References Cited

U.S. PATENT DOCUMENTS

| | | | |
|---|---|---|---|
| 3,520,722 | 7/1970 | Scott, Jr. | 117/213 |
| 3,745,647 | 7/1973 | Boleky, III | 29/571 |
| 3,861,968 | 1/1975 | Magdo et al. | 148/175 |
| 4,101,344 | 7/1978 | Kooi et al. | 148/1.5 |
| 4,373,248 | 2/1983 | McElroy | 29/571 |
| 4,506,437 | 3/1985 | Godejahn, Jr. | 29/577 |
| 4,551,910 | 11/1985 | Patterson | 29/576 |
| 4,593,453 | 6/1986 | Tam et al. | 29/571 |
| 4,713,356 | 12/1987 | Hiruta | 257/752 |
| 4,764,248 | 8/1988 | Bhattacherjee et al. | 156/643 |
| 5,258,333 | 11/1993 | Shappir et al. | 437/235 |
| 5,258,643 | 11/1993 | Cohen | 257/530 |
| 5,449,640 | 9/1995 | Hunt et al. | 437/190 |
| 5,489,790 | 2/1996 | Lage | 257/330 |

FOREIGN PATENT DOCUMENTS

| | | | |
|---|---|---|---|
| 2 579 82 SHO | 10/1986 | France | H01L 21/316 |
| 63-289820 | 11/1988 | Japan | |
| 40508 77 A | 2/1993 | Japan | |

OTHER PUBLICATIONS

Tombs et al, "A New Insulated–Gate Silicon Transistor," *Proceedings of the IEEE*, pp. 87–88, (1966).
Peter Van Zant, *Microchip Fabrication* (McGraw–Hill Publishing Co. 1990), pp. 143–144.
Wolf et al, *Silicon Processing for the VLSI Era*, vol. 1: *Process Technology* (Lattice Press 1986), pp. 57–58.
Wolf et al, *Silicon Processing for the VLSI Era*, vol. 2: *Process Integration* (Lattice Press), p. 21.
Runyan et al, *Semiconductor Integrated Circuit Processing Technology* (Addison–Wesley 1990), p. 147.
S. M. Sze, "Physics of Semiconductor Devices," 1981, pp. 374, 378–379, 441.

*Primary Examiner*—Jerome Jackson
*Assistant Examiner*—John F. Guay
*Attorney, Agent, or Firm*—Theodore E. Galanthay; Kenneth C. Hill; Lisa K. Jorgenson

[57] ABSTRACT

A method is provided for forming an improved device dielectric of a semiconductor integrated circuit, and an integrated circuit formed according to the same. For scaling geometries for use in the submicron regime, a composite dielectric layer used as a device dielectric is formed over a plurality of active areas adjacent to a field oxide region. The composite dielectric layer is formed before the field oxide region is formed and comprises a non-porous silicon nitride layer. The non-porous silicon nitride layer preferably comprises a thin deposited silicon nitride layer overlying a thin nitridized region of the substrate. The silicon nitride layer is partially oxidized during the subsequent formation of a field oxide region between the plurality of active areas. An oxide layer may be formed over the silicon nitride layer before the formation of the field oxide region which will then be densified during the field oxide formation. The composite dielectric layer is then patterned and etched to form the dielectric portion of various integrated circuit devices.

9 Claims, 4 Drawing Sheets

DIELECTRIC IN AN INTEGRATED CIRCUIT

FIELD OF THE INVENTION

This is a continuation of prior application Ser. No. 08/438,391 filed on May 10, 1995, now abandoned, which is a divisional of prior application Ser. No. 08/251,781, filed on May 31, 1994, now abandoned which is a continuation-in-part of copending application Ser. No. 08/172,636 filed Dec. 22, 1993 (Attorney's Docket No. 92-C-70), assigned to SGS-Thomson Microelectronics, Inc. and incorporated herein by this reference.

The present invention relates generally to semiconductor integrated circuit processing, and more specifically to an improved method of forming transistor gate and capacitor dielectrics and for definition of isolation of areas in an integrated circuit.

BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions.

Device structures are constantly being proposed with the objective of producing higher response speeds, higher device yields and reliability, lower power consumption and higher power handling capability. Many of the device improvements are achieved by scaling down or miniaturizing the devices. One approach is to simply scale down all process variables, dimensions and voltages. This approach includes, among other factors, for example for the typical MOS device, scaling dielectric thicknesses, channel lengths and widths, junction widths and doping levels. With this approach, the number of devices per unit area increases, threshold voltages decrease, delay time across channels decreases and power dissipated per area decreases. All device parameters, however, do not need to be scaled by the same constant. A design or process engineer may scale some device parameters independently of others which would optimize device operation. This more flexible approach would allow for a choice in geometries to fit with various tradeoffs for device optimization, rather than choosing a more strict scaling approach.

One of the more critical parameters that needs to be scaled to produce a highly reliable semiconductor device is the thickness of the dielectrics, for example the dielectrics used to form a gate dielectric of a MOS transistor, as an SRAM or DRAM, or a tunnel dielectric of floating gate memories or MNOS devices. Scaling dielectrics to produce highly reliable gate dielectrics has proven to be difficult. For example, gate dielectrics are typically made of pure silicon dioxide ($SiO_2$), thermally grown or deposited. The integrity of silicon dioxide decreases as the thickness of the layer decreases producing more defects, for example, pinholes. The inability to produce uniform and reliable, scaled pure $SiO_2$ gate oxides causes device failures and makes thinning of these layers impracticable.

In addition to the geometries and sizes of active components and the ability to scale process variables, the chip area also depends on the isolation technology used. Sufficient electrical isolation must be provided between active circuit elements so that leakage current and low field device threshold voltages do not cause functional or specification failures. Increasingly more stringent specifications, together with the demand, for example, for smaller memory cells in denser memory arrays, places significant pressure on the isolation technology in memory devices, as well as in other modern integrated circuits.

A well-known and widely-used isolation technique is the local oxidation of silicon to form a field oxide region between active areas, commonly referred to as LOCOS. The LOCOS process was a great technological improvement in reducing the area needed for the isolation regions and decreasing some parasitic capacitances. This process though is subject to certain well-known limitations, such as the lateral encroachment of the oxide into the active areas, known as "birdbeaking", additional topography added to the integrated circuit surface and undesired nitride spots forming along the interface of the silicon substrate and silicon oxide regions, known as the "Kooi" effect. Thermally grown gate oxides formed subsequent to the formation of the field oxide are impeded in the region of these nitride spots. Typically, these nitride spots are removed before gate oxides are formed, as with the well-known sacrificial oxide process as described more fully in U.S. Pat. No. 4,553,314 issued on Nov. 19, 1985 to Chan et al. However, this process of removing the nitride spots increases complexity and thus additional manufacturing costs as well as adding additional topography to the wafer causing step coverage problems at later stages. It would be desirable to have a high integrity scaled dielectric, for example, one that is used in association with gate electrodes for MOS transistors and which is formed in a manner to reduce subsequent processing steps.

It is therefore an object of the present invention to provide a method of forming improved dielectrics in active areas for scaled semiconductor devices.

It is a further object of the present invention to provide the scaled dielectrics for improving the gates of transistors.

It is a further object of the present invention to provide a method of forming the gate dielectrics adjacent to isolation regions which requires significantly fewer subsequent processing steps thereby decreasing the manufacturing complexity and produce higher yields and reliability.

It is yet a further object of the present invention to provide a method of forming improved gates of transistors increasing the planarity of the surface of the wafer thereby minimizing subsequent step coverage problems.

Other objects and advantages of the present invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. To provide a high integrity scaled device dielectric, a composite dielectric layer is formed over the substrate comprising a thin non-porous silicon nitride layer. The non-porous silicon nitride layer is preferably formed by first annealing the silicon substrate in an ambient comprising nitrogen forming an annealed nitride layer having a thickness of about 5 to about 70 angstroms. A silicon nitride layer is then formed over the annealed nitride layer by LPCVD to a depth of about 5 to about 50 angstroms. An oxide layer may also be formed over the silicon nitride layer by LPCVD and at high temperatures in the range of approximately 500°–1000° C. to a depth of about 5 to about 50 angstroms. An opening is formed in the composite dielectric exposing a portion of the silicon substrate. A field oxide region is thermally grown in the opening using the composite dielectric as a mask to protect the substrate underlying the mask. The process of growing the field oxide further oxidizes a portion of the silicon nitride layer. A polysilicon layer is formed over the composite dielectric, before or after the field oxide region is grown. If the polysilicon layer is formed before the field oxide is grown, it is formed over the deposited oxide layer, preferably to a depth such that an upper surface of the field oxide region is substantially planar with an upper surface of the polysilicon layer. If the polysilicon layer is formed after the field oxide is grown, it may be formed over either the silicon nitride or deposited oxide layers.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
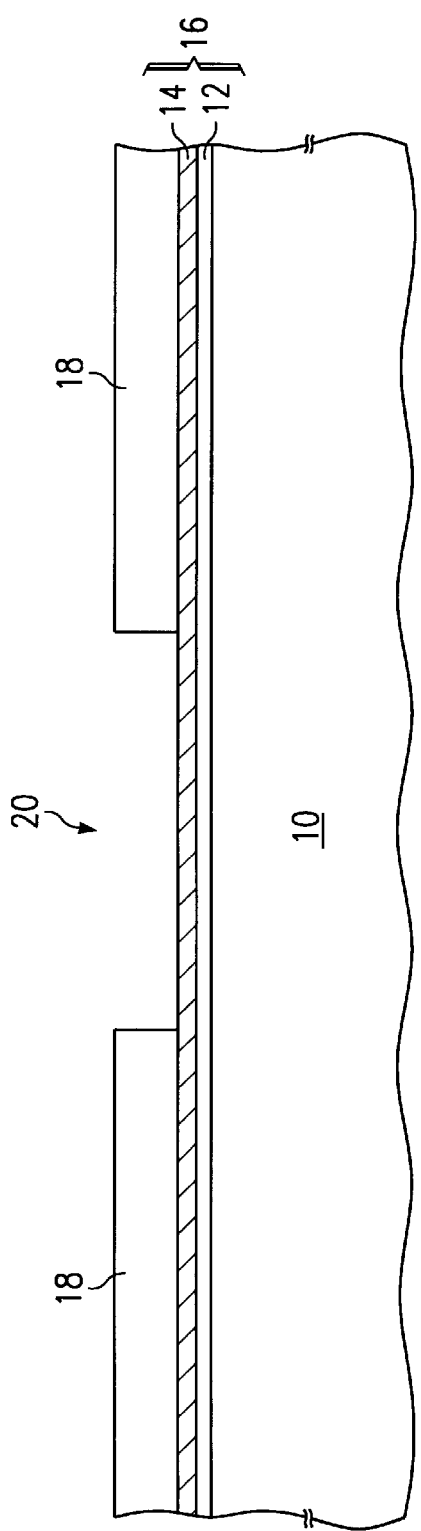
FIGS. 1, 2A and 3–4 are cross-sectional views of the fabrication of a semiconductor integrated circuit according to one embodiment of the present invention.

Referring now to FIGS. 1–4, a first embodiment of the present invention will now be described in detail. FIG. 1 illustrates a portion of a wafer, in cross-section, which has a surface at which isolation structures and devices in adjacent active areas are to be formed. As shown in FIG. 1, an integrated circuit is to be formed on a silicon substrate 10. The silicon substrate may be p- or n-doped silicon depending upon the location in the wafer where the isolation and active devices are to be formed. The upper surface of the substrate is annealed in an ambient comprising nitrogen. This annealing process eliminates any native oxide which may have formed on the surface of the substrate and forms a uniform nitridized layer 12 with few crystal defects. The process may be carried out by a furnace anneal but preferably is done by rapid thermal annealing to minimize the spreading of dopants that may have been previously formed in the substrate. A furnace anneal may be carried out at temperatures ranging from approximately 800° to 1100° C. The rapid thermal anneal (RTP) process may be carried out at temperatures ranging from approximately 900°–1200° C. The formation of the nitridized layer 12 is a self-limiting process and is easily controlled to a depth of about 5 to about 70 angstroms.

A thin layer of silicon nitride 14 can be formed over the nitridized layer 12, preferably by low pressure chemical vapor deposition (LPCVD), although atmospheric pressure chemical vapor deposition (APCVD) or plasma-enhanced chemical vapor deposition (PECVD) may be used. The LPCVD process provides a more uniform layer with higher integrity, that is, more completed bonds and less defects. Silicon nitride layer 14 is preferably formed to a depth of about 5 to about 50 angstroms. The nitridized layer 12 provides a good interface between the silicon substrate 10 and silicon nitride layer 14 by reducing the roughness of the silicon substrate before layer 14 is formed and by reducing trapping effects. Layers 12 and 14 form a thin composite dielectric layer 16 having an over all thickness of about 10 to 120 angstroms. The silicon nitride layer 14 and nitridized layer 12 may increase the composite layer's dielectric constant and reduce the defect density of the composite layer, for example, by reducing the effect of any pinholes between an upper conductive layer and the substrate.

Photoresist layer 18 is formed over the surface of the wafer and etched to form opening 20. Composite dielectric layer 16 is etched in opening 20 to expose the surface of the substrate 10 in opening 20. An anisotropic etch may be used to etch the opening. The opening 20 or location where an isolation structure is to be formed may be within a single doped region, for example, in an n- or p-well or may also be at boundaries between doped regions of opposite conductivity type, such as between n- and p-wells. Prior to the oxidation of the silicon substrate in opening 20, a dopant may be implanted into the substrate in the opening. This dopant, typically boron for n-channel devices, will form a channel stop implant.

Figure 2A:
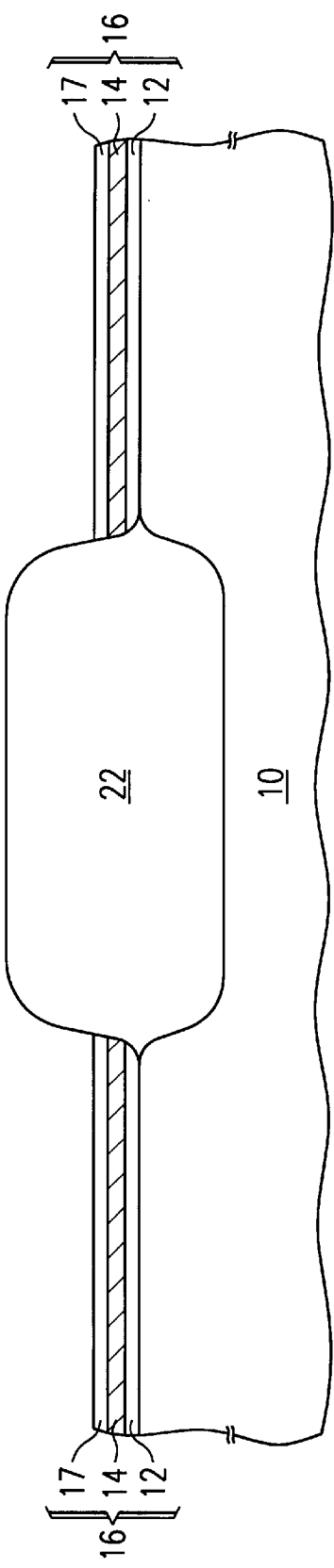

Referring now to FIG. 2A, photoresist layer 18 is removed and an oxidation step is performed to thermally grow a field oxide region 22. The field oxide region will electrically isolate devices in the active areas such as transistors which may be in the same well or transistors in adjacent wells. The oxidation is typically performed in steam for about 2 to 8 hours at approximately 800°–1100° C. The field oxide region is preferably formed having a thickness of about 500 to about 4000 angstroms. The composite dielectric layer 16 acts as a hard mask to protect the substrate underlying the composite layer 16 during the formation of the field oxide region 22. This process eliminates the need for a thick nitride layer to be formed over the composite layer as in the standard LOCOS process to protect the substrate during the formation of the field oxide region 22. During the formation of the field oxide region 22, a portion of the nitride layer 14 will be oxidized forming a thin oxide region 17 over the nitride layer 14. The amount of oxidation of nitride layer 14 and the resulting thickness of the overall oxide formed from this oxidation step will depend on the amount of field oxide grown. For example, as 1 angstrom of the nitride layer is oxidized, approximately 1.64 angstroms of oxide will be formed during this oxidation step. Thus, the resulting total thickness of composite layer 17 will depend on the original thickness of nitride layer 14 and the amount of field oxide grown between the active areas, but in any case should be controllable due to the low oxidation rate of silicon nitride. The oxidation of nitride layer 14 will help to seal any pinholes in the nitride layer. In addition, layer 14 protects thin nitridized layer 12 from complete oxidation during the growth of field oxide region 22. Layers 12 and 14 and oxide region 17 will now form the composite dielectric layer 16.

Figure 2B:
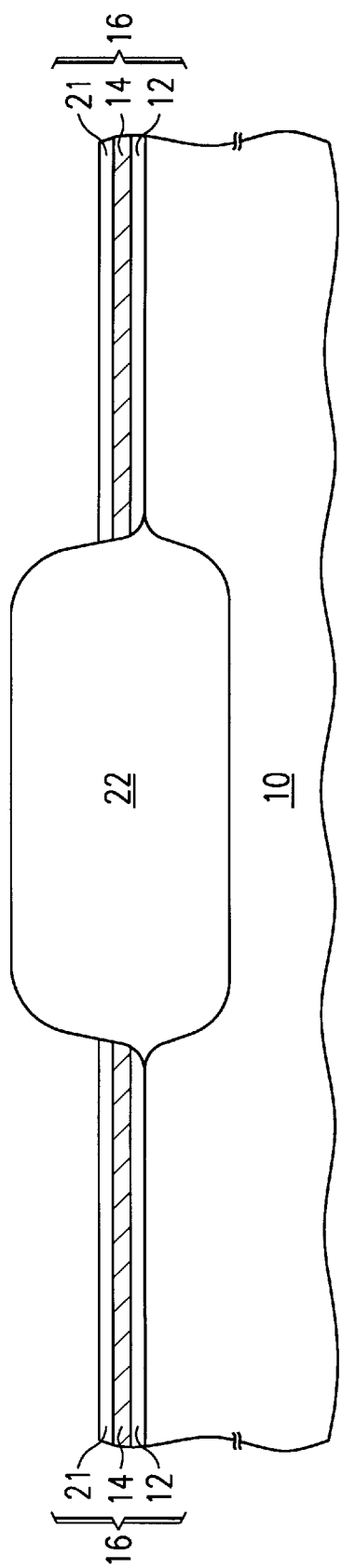
FIG. 2B is a cross-sectional view of the fabrication of a semiconductor integrated circuit according to an alternative embodiment of the present invention.

As an alternative embodiment as shown in FIG. 2B, a thin oxide layer 21 may be formed over silicon nitride layer 14 to a thickness of about 5 to about 50 angstroms before field oxide formation. Oxide layer 21 is formed preferably by an LPCVD process to form a uniform, high integrity film at temperatures between approximately 500° to 1000° C. Layers 12, 14 and 21 now form the thin composite dielectric layer 16 having an overall thickness of about 15 to about 170 angstroms. The composite layer 16 may be used to improve devices, for example, a gate dielectric of a MOS transistor or a tunnel oxide layer of a non-volatile memory device such as an EEPROM. Oxide layer 21 will reduce the amount of oxidation of silicon nitride layer 14 during the growth of field oxide region 22. In addition, oxide layer 16 will be densified during the formation of the field oxide region due to the kinetics of thermally growing the field oxide region. This process further reduces the defects such as pinholes between an upper conductive layer and a lower substrate region. The nitridized and silicon nitride layers 12 and 14 act as a sealed interface under the oxide layer 16 during formation of the field oxide region to reduce the well known bird's beak effect or encroachment of the field oxide into the active areas.

Figure 3:
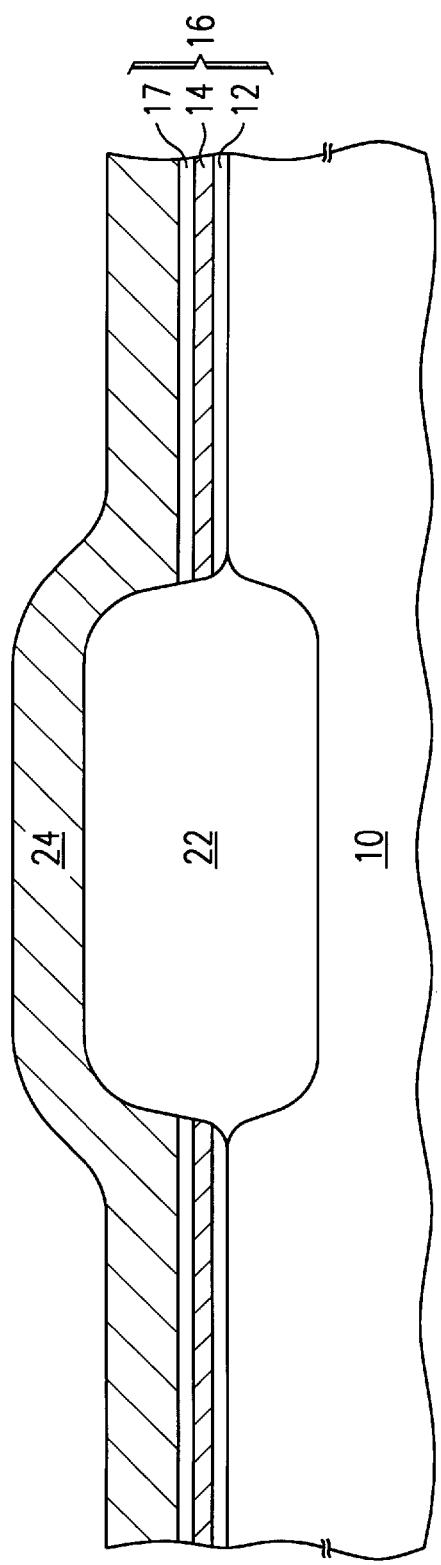

Referring now to FIG. 3, a polysilicon layer 24 is deposited over composite dielectric layer 16, preferably to a depth of between about 300 to about 2500 angstroms. For ease of illustration, the composite layer 16 will be shown with the oxidized portion of the nitride layer 17 but could also be the thin oxide layer 21 overlying the nitride layer 14. Polysilicon layer 24 may form portions of devices, for example, a gate electrode of a MOS transistor or a floating gate of an EEPROM transistor. A blanket p- or n-type dopant, typically phosphorous, may be implanted or diffused into the polysilicon layer 24 to increase the conductivity of the polysilicon layer.

Figure 4:
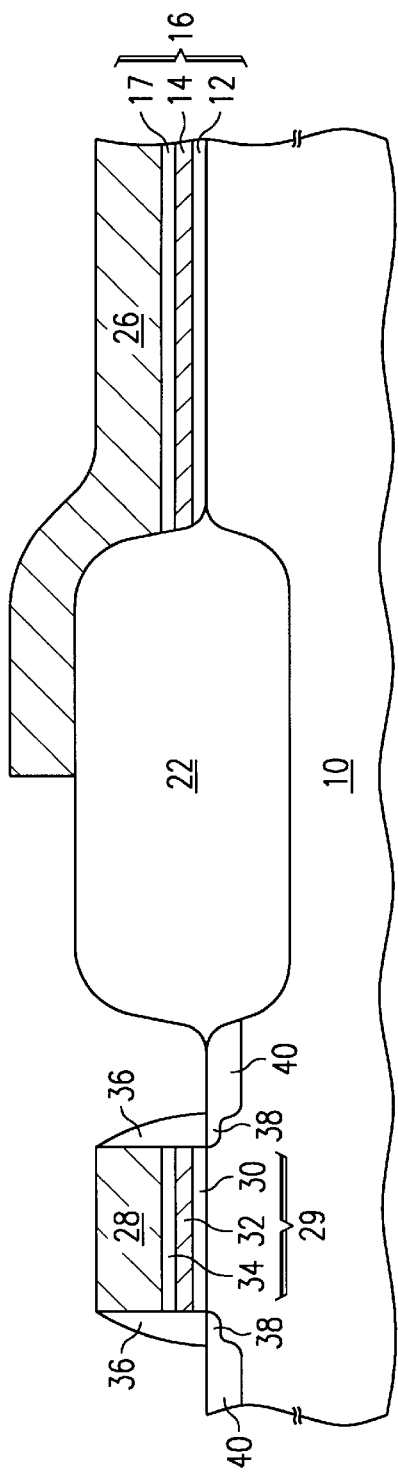

Typically in the prior art, the mask used to protect the active areas during field oxide formation are removed and the nitride spots are then removed which form at the silicon/silicon dioxide interface: the "Kooi" effect. A device structure in the active areas such as a gate electrode are then formed in the active areas. Unlike the prior art, the present invention does not remove the mask used during the formation of the field oxide region but instead retains the composite dielectric 16 and deposits the polysilicon layer to complete portions of various device structures. Since the original mask is used for subsequently formed devices in the active areas, the mask is not significantly impacted by the "Kooi" nitride spots formed during the growth of the field oxide region. For purposes of illustration, as shown in FIG. 4, the polysilicon layer 24 and composite dielectric 16 may be etched to form an interconnect 26 overlying composite dielectric 16 and a gate electrode of a MOS transistor 34 overlying the composite dielectric which forms the gate dielectric. The gate dielectric 29 will comprise the nitridized layer 30, deposited silicon nitride layer 32 and either an oxidized portion of the silicon nitride layer or a thin oxide layer 34. As is known in the art, gate electrode 28 and gate dielectric 29 may have oxide sidewall spacers 36, lightly doped drain regions 38 and more heavily doped source and drain regions 40.

Figure 5:
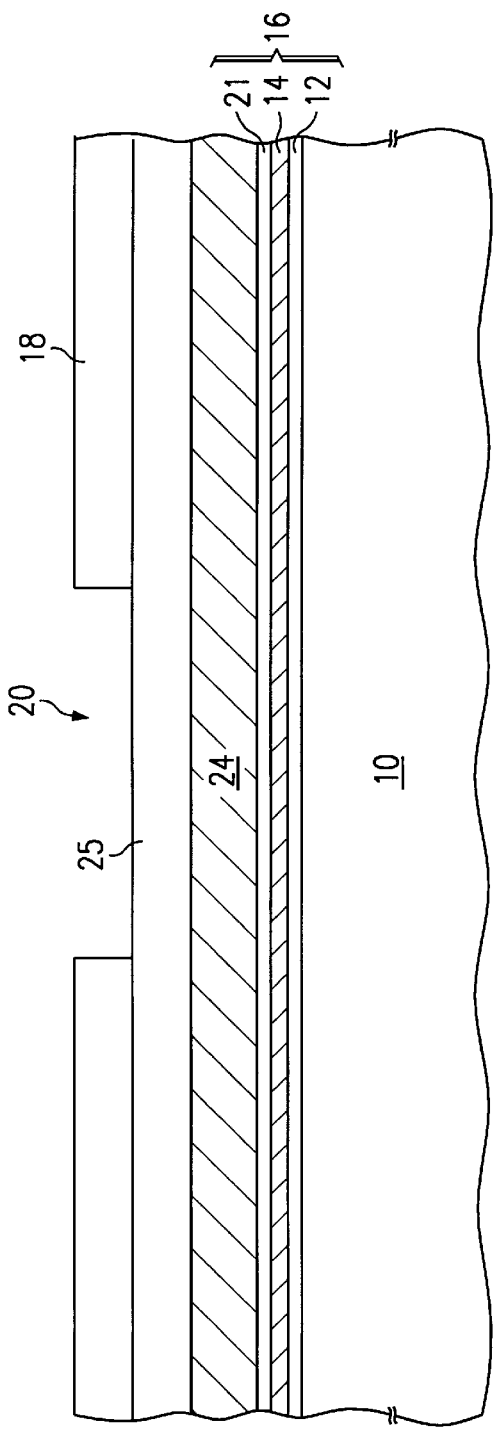
FIGS. 5–7 are cross-sectional views of the fabrication of a semiconductor integrated circuit according to another alternative embodiment of the present invention.
Figure 6:
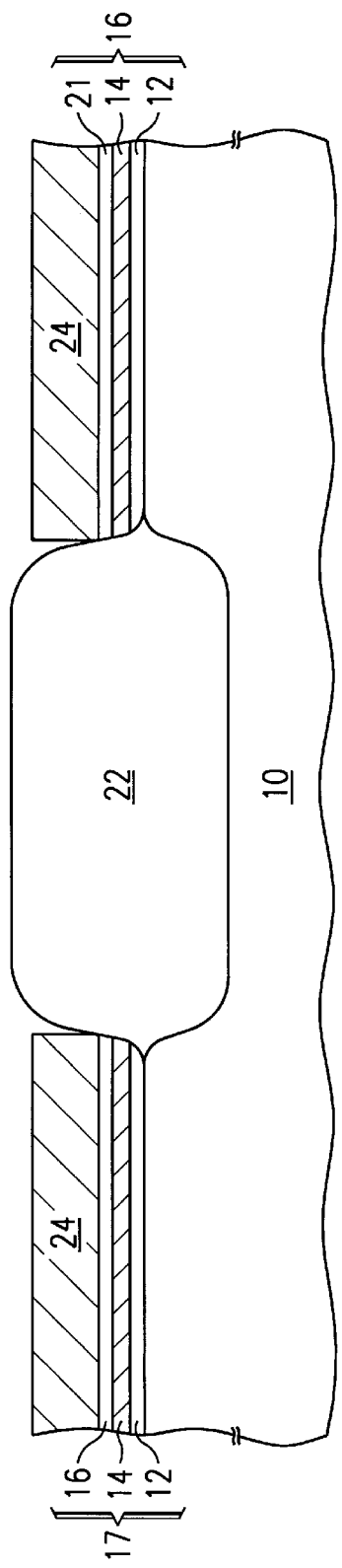
Figure 7:
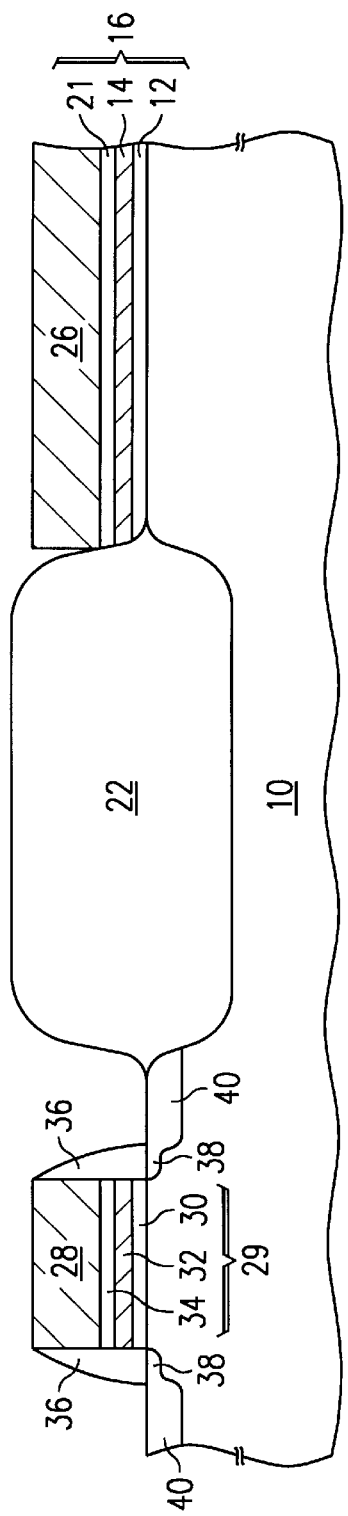

Referring now to FIGS. 5–7, an alternative embodiment of the present invention is shown. The same reference numerals are used for the same areas as described above and shown in FIGS. 1, 2B and 3–4. As shown in FIG. 5, polysilicon layer 24 is formed to a depth of about 300 to about 2500 angstroms over composite dielectric layer 16 before the field oxide region is grown. As is known in the art, a nitride layer 25 is formed over the polysilicon layer 24. Photoresist 18 is formed over the nitride layer 25, patterned and etched to form opening 20. Polysilicon layer 24 and composite layer 16 are etched to expose substrate 10 in opening 20.

Referring to FIG. 6, photoresist layer 18 is removed and field oxide 22 is thermally grown in the opening to a depth of about 500 to about 3000 angstroms, after which nitride layer 25 is removed. An additional advantage will be achieved if field oxide 22 is grown to a depth whereby its upper surface is substantially planar with the upper surface of polysilicon layer 24. The topography of the wafer will be more planar before subsequent processing steps begin. As illustrated in FIG. 7, polysilicon layer 24 and composite layer 16 are etched to form devices, for example, an interconnect 26 and gate electrode 28 having a gate dielectric 29 comprising nitridized layer 30, silicon nitride layer 32 and oxidized region 34 of the silicon nitride layer. As described above, also illustrated are oxide sidewall spacers 36, lightly doped drain regions 38 and more heavily doped source and drain regions 40.

As shown in FIG. 7, polysilicon interconnect 26 does not cross over field oxide region 22. If an interconnect is required to cross over field oxide region 22, a low resistance layer may be formed over the polysilicon layer 26 which may be patterned and etched to cross over the field oxide region.

The present invention provides for a significantly improved device dielectric layer which contributes to the overall ability to scale devices to meet the growing demands in the submicron regime. The present invention further substantially reduces the number of processing steps needed to form a high integrity device, for example, a gate electrode or interconnect, by eliminating the need to remove the "Kooi" nitride spots. Decreasing the number of processing steps increases device yield and reliability due to the lower probability of creating defects. Manufacturing costs are further decreased. Additionally, by forming a substantially planar upper surface between the field oxide region and the polysilicon layer such that the polysilicon layer does not cross over the upper surface of the field oxide region, the topography is more planar for subsequent process steps reducing step coverage problems.

What is claimed is:

1. The structure of a portion of a semi-conductor integrated circuit formed at a surface of a body, comprising:
   a plurality of active regions at the surface;
   an isolation structure formed above the surface and into a recess of the surface between a pair of the plurality of active regions;
   a composite dielectric layer in contact with at least a portion of each active region within the pair of active regions, and wherein the composite layer comprises a thin, non-porous silicon nitride layer including a LPCVD silicon nitride having a thickness of about 5 to about 50 angstroms overlying a nitridized layer formed into a recess of the surface in each active region; and
   a thin high temperature oxide layer having a thickness of about 5 to about 50 angstroms overlying the silicon nitride layer.

2. The structure of claim 1, wherein the oxide layer is an LPCVD oxide.

3. The structure of claim 1, further comprising a polysilicon layer overlying the composite dielectric, wherein an upper surface of the polysilicon layer is substantially planar with an upper surface of the isolation structure.

4. The structure of claim 1, wherein the non-porous silicon nitride layer consists of a LPCVD silicon nitride overlying a nitridized layer.

5. The structure of claim 1, wherein the nitridized layer comprises a nitrogen annealed region of the body.

6. The structure of claim 1, wherein the nitridized layer has a thickness of about 5 to about 70 angstroms.

7. The structure of a portion of a semiconductor integrated circuit formed at a surface of a body, comprising:
   a plurality of active regions at the surface;
   an isolation structure formed above the surface and into a recess of the surface between a pair of the plurality of active regions; and
   a composite dielectric layer in contact with at least a portion of the surface of each active region within the pair of active regions, and wherein the composite layer comprises a thin, high temperature, oxide layer overlying a non-porous silicon nitride layer including a first layer overlying a second layer, wherein the first layer has physical characteristics of a deposited silicon nitride layer and a thickness from about 5 to about 50 angstroms and the second layer has physical characteristics of a nitridized layer.

8. The structure of a portion of a semiconductor integrated circuit formed at a surface of a body, comprising:
   a plurality of active regions at the surface;
   an isolation structure formed above the surface and into a recess of the surface between a pair of the plurality of active regions; and
   a composite dielectric layer in contact with at least a portion of the surface of each active region within the pair of active regions and having a thickness greater than about 70 angstroms, wherein the composite layer comprises:
      a silicon nitride layer comprising a LPCVD silicon nitride layer overlying a nitridized layer having a thickness from about 5 to about 70 angstroms, and
      an oxidized silicon nitride layer overlying the LPCVD silicon nitride layer.

9. The structure of claim 8, wherein the LPCVD silicon nitride layer has thickness from about 5 angstroms to about 50 angstroms.

* * * * *